(12) United States Patent
Hung et al.

(10) Patent No.: US 11,570,606 B2
(45) Date of Patent: Jan. 31, 2023

(54) BLUETOOTH CONTROLLER CIRCUIT FOR REDUCING POSSIBILITY OF NOISE GENERATION

(71) Applicant: Realtek Semiconductor Corp., Hsinchu (TW)

(72) Inventors: Hou-Tse Hung, Hsinchu (TW); Liang-Hui Li, Hsinchu (TW); Chia Chun Hung, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/677,174

(22) Filed: Feb. 22, 2022

(65) Prior Publication Data

US 2022/0271759 A1    Aug. 25, 2022

Related U.S. Application Data

(60) Provisional application No. 63/151,067, filed on Feb. 19, 2021.

(51) Int. Cl.
*H04W 4/80* (2018.01)
*H03L 7/08* (2006.01)
*H03L 7/081* (2006.01)

(52) U.S. Cl.
CPC ............. *H04W 4/80* (2018.02); *H03L 7/0805* (2013.01); *H03L 7/0816* (2013.01); *Y02D 30/70* (2020.08)

(58) Field of Classification Search
CPC .............................. H04W 4/80; Y02D 30/70
See application file for complete search history.

(56) References Cited

U.S. PATENT DOCUMENTS

| 11,146,273 B2* | 10/2021 | Hung | H03K 21/403 |
| 2015/0296073 A1* | 10/2015 | Lo | H04W 4/80 |
| | | | 455/41.2 |

* cited by examiner

*Primary Examiner* — Patrick O Neill
(74) *Attorney, Agent, or Firm* — Birch, Stewart, Kolasch & Birch, LLP

(57) ABSTRACT

A Bluetooth controller circuit includes: a clock counter arranged to operably generate a first count value corresponding to a reference clock signal; a count value adjusting circuit arranged to operably generate a second count value according to the first count value; a time slot determining circuit arranged to operably determine timing of respective transmission slots according to the second count value; a transceiver circuit arranged to operably transmit Bluetooth signal in transmission slots determined by the time slot determining circuit; and a control circuit, coupled with the count value adjusting circuit, the time slot determining circuit, and the transceiver circuit, and arranged to operably control operations of the count value adjusting circuit, the time slot determining circuit, and the transceiver circuit.

10 Claims, 8 Drawing Sheets

BLUETOOTH CONTROLLER CIRCUIT FOR REDUCING POSSIBILITY OF NOISE GENERATION

CROSS-REFERENCE TO RELATED APPLICATIONS

This application claims the benefit of priority to U.S. Provisional Application Ser. No. 63/151,067, filed on Feb. 19, 2021; the entirety of which is incorporated herein by reference for all purposes.

BACKGROUND

The disclosure generally relates to Bluetooth technologies and, more particularly, to a Bluetooth controller circuit for reducing possibility of noise generation.

As is well known in related art, a Bluetooth communication device conducts Bluetooth packet transmission in the transmission slot (TX slot) defined by the Bluetooth communication protocols, and most transmission slots are periodic slots. In other words, the operations of transmitting Bluetooth packets conducted by the Bluetooth communication device are typically periodical operations. Accordingly, from another aspect, the Bluetooth signals transmitted by the Bluetooth communication device typically has a specific frequency.

However, since the Bluetooth communication protocols specifies the period length (e.g., 312.5 µs) of some transmission slots, the frequency of some Bluetooth signals issued by the Bluetooth communication device will fall within the frequency range that can be perceived by human ears. Therefore, the traditional Bluetooth communication device sometimes generates noises that can be perceived by human ears during the transmission of Bluetooth signals, which may negatively affect the user experience of the Bluetooth communication device, and may even cause the user to feel uncomfortable.

SUMMARY

An example embodiment of a Bluetooth controller circuit is disclosed, comprising: a clock counter, arranged to operably generate a first count value corresponding to a reference clock signal; a count value adjusting circuit, coupled with the clock counter, and arranged to operably adjust the first count value to generate a second count value, so that magnitudes of the second count value intermittently exhibits a non-linear change; a time slot determining circuit, coupled with the count value adjusting circuit, and arranged to operably adjust timing of respective transmission slots according to the second count value to cause interval between adjacent transmission slots to not remain consistency; a transceiver circuit, coupled with the time slot determining circuit, and arranged to operably transmit Bluetooth signals in transmission slots configured by the time slot determining circuit; and a control circuit, coupled with the count value adjusting circuit, the time slot determining circuit, and the transceiver circuit, and arranged to operably operations of the count value adjusting circuit, the time slot determining circuit, and the transceiver circuit; wherein the time slot determining circuit is further arranged to operably adjust trigger timing of respective transmission events within a target transmission slot according to the second count value to cause interval between adjacent transmission events in the target transmission slot to not remain consistency.

Another example embodiment of a Bluetooth controller circuit is disclosed, comprising: a clock counter arranged to operably generate a first count value corresponding to a reference clock signal; a count value adjusting circuit, coupled with the clock counter, and arranged to operably generate a second count value according to the first count value; a time slot determining circuit, coupled with the count value adjusting circuit, and arranged to operably configure timing of respective transmission slots according to the second count value; a transceiver circuit, coupled with the time slot determining circuit, and arranged to operably transmit Bluetooth signals in transmission slots configured by the time slot determining circuit; a control circuit, coupled with the count value adjusting circuit, the time slot determining circuit, and the transceiver circuit, and arranged to operably control operations of the count value adjusting circuit, the time slot determining circuit, and the transceiver circuit.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
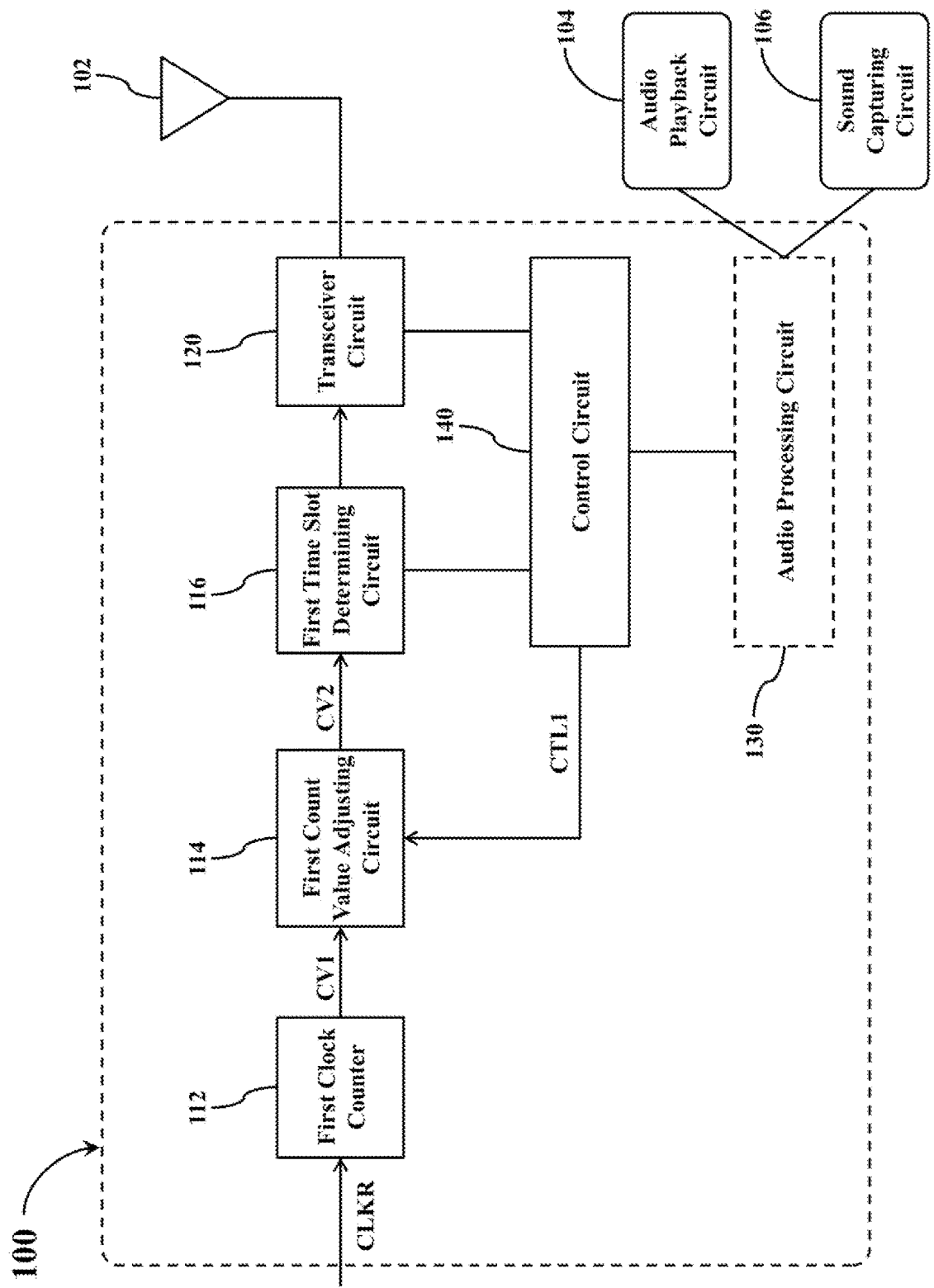
FIG. 1 shows a simplified functional block diagram of a Bluetooth controller circuit according to a first embodiment of the present disclosure.

FIG. 1 shows a simplified functional block diagram of a Bluetooth controller circuit according to a first embodiment of the present disclosure. As shown in FIG. 1, the Bluetooth controller circuit 100 comprises a first clock counter 112, a first count value adjusting circuit 114, a first time slot determining circuit 116, a transceiver circuit 120, an audio processing circuit 130, and a control circuit 140.

The first clock counter 112 is arranged to operably generate a first count value CV1 corresponding to a reference clock signal CLKR. For example, the first clock counter 112 may conduct a counting operation based on a specific edge (e.g., the rising edge or the falling edge) of the reference clock signal CLKR to generate a first count value CV1 corresponding to the quantity of the specific edge of the reference clock signal CLKR. In general, the reference clock signal CLKR has a stable frequency, and thus the magnitude of the first count value CV1 generated by the first clock counter 112 will increase stably and exhibit a linear change. The first clock counter 112 may reset the magnitude of the first count value CV1 at an appropriate time.

The first count value adjusting circuit 114 is coupled with the first clock counter 112, and arranged to operably generate a second count value CV2 according to the first count value CV1.

The first time slot determining circuit 116 is coupled with the first count value adjusting circuit 114, and arranged to operably decide the timing of respective transmission slots (TX slots) and the timing of respective reception slots (RX slots) according to the second count value CV2.

The transceiver circuit 120 is coupled with the first time slot determining circuit 116, and arranged to operably transmit Bluetooth signals in the transmission slots configured by the first time slot determining circuit 116, and arranged to operably receive Bluetooth signals in the reception slots configured by the first time slot determining circuit 116. In practice, the transceiver circuit 120 may be coupled with an appropriate antenna 102 of various types.

In practice, the transceiver circuit 120 may be realized with various appropriate Bluetooth communication circuits supporting various versions of Bluetooth communication protocols.

The audio processing circuit 130 is coupled with an audio playback circuit 104 and a sound capturing circuit 106. In practice, the audio playback circuit 104 may be realized with various appropriate circuits capable of receiving and playing audio data, such as various speakers, ear phones, headset devices, or the like. The sound capturing circuit 106 may be realized with various appropriate circuits capable of capturing sound and converting sound into corresponding audio signals, such as various types of microphones. The audio processing circuit 130 may be realized with a digital computing circuit, a microprocessor, an ASIC, or a digital-to-analog converter (DAC) capable of conducting various encoding/decoding processing and/or data format conversion on audio data.

The control circuit 140 is coupled with the first count value adjusting circuit 114, the first time slot determining circuit 116, the transceiver circuit 120, and the audio processing circuit 130, and arranged to operably control the operations of the first count value adjusting circuit 114, the first time slot determining circuit 116, the transceiver circuit 120, and the audio processing circuit 130.

In operations, the audio processing circuit 130 may process the audio data transmitted from other Bluetooth devices (e.g., to encode or decode the audio data, and/or to conduct format conversion on the audio data) according to the instructions of the control circuit 140, and may control the audio playback circuit 104 to play the contents of the audio data. The audio processing circuit 130 is further arranged to operably encode the sounds captured by the sound capturing circuit 106 to generate corresponding sound data. The control circuit 140 may transmit the sound data generated by the audio processing circuit 130 to other Bluetooth devices (not shown) through the transceiver circuit 120.

In addition, the control circuit 140 may utilize a first control signal CTL1 to control the first count value adjusting circuit 114 to generate the second count value CV2 by adopting different approaches in different operation stages of the Bluetooth controller circuit 100, and may control the first time slot determining circuit 116 to decide the timing of respective transmission slots by adopting different approaches.

In practice, the control circuit 140 may be realized with an appropriate packet processing circuit, a digital computing circuit, a microprocessor, a single processor module, a combination of multiple processor modules, or an ASIC having appropriate computing capabilities and capable of parsing and generating Bluetooth packets.

The term "Bluetooth packet" used throughout the description and the claims also encompass various protocol data units (PDUs) specified by various Bluetooth communication standards.

In practical applications, different functional blocks of the aforementioned Bluetooth controller circuit 100 may be realized with separate circuits or may be integrated into a single IC chip or a single device. For example, the aforementioned transceiver circuit 120 and/or audio processing circuit 130 may be integrated into the control circuit 140.

Alternatively, all functional blocks of the Bluetooth controller circuit 100 may be integrated into a single IC chip, a mobile communication device (e.g., a cell phone), a wearable device, a tablet computer, a notebook computer, a desktop computer, an audio broadcast system, a voice guidance system, a voice broadcasting system, a vehicular communication device, a satellite communication device, a smart TV, a Bluetooth smart speaker, or the like.

The operation of dynamically adjusting slot timing conducted by the Bluetooth controller circuit 100 will be further described in the following by reference to FIG. 2 through FIG. 7. FIG. 2 through FIG. 7 show simplified schematic slot timing diagrams illustrating dynamical slot timing adjustment conducted by the Bluetooth controller circuit of FIG. 1 according to different embodiments of the present disclosure.

In FIG. 2 through FIG. 7, the upper part of the drawing is the slot timing when the Bluetooth controller circuit does not adjust the timing of the transmission slots, and the lower part of the drawing is the slot timing of the transmission slots adjusted by the Bluetooth controller circuit 100.

When there is no need to adjust the timing of the transmission slots, the control circuit 140 may instruct the first count value adjusting circuit 114 to simply utilize the first count value CV1 generated by the first clock counter 112 to be the second count value CV2. In other words, the second count value CV2 will be the same as the first count value CV1, and thus the magnitude of the second count value CV2 also increases stably and exhibits a linear change.

In this situation, as shown in the upper part of FIG. 2 through FIG. 7, when the second count value CV2 reaches a first predetermined value at a first time point T1, the first time slot determining circuit 116 may generate a transmission slot indication signal 210 corresponding to a start point of a first transmission slot 201, so that the transceiver circuit 120 begins a Bluetooth signal transmission operation according to the transmission slot indication signal 210. When the second count value CV2 reaches a second predetermined value, the first time slot determining circuit 116 may generate a reception slot indication signal 240 corresponding to the start point of a first reception slot 203, so that the transceiver circuit 120 begins a Bluetooth signal receiving operation according to the reception slot indication signal 240.

Then, when the second count value CV2 reaches a third predetermined value at a second time point T2, the first time slot determining circuit 116 generate a transmission slot indication signal 220 corresponding to a start point of a second transmission slot 205, so that the transceiver circuit 120 again starts a Bluetooth signal transmission operation according to the transmission slot indication signal 220. When the second count value CV2 reaches a fourth predetermined value, the first time slot determining circuit 116 may generate a reception slot indication signal 250 corresponding to a second reception slot 207, so that the transceiver circuit 120 again starts a Bluetooth signal receiving operation according to the reception slot indication signal 250.

Afterwards, when the second count value CV2 reaches a fifth predetermined value at a third time point T3, the first time slot determining circuit 116 may generate a transmission slot indication signal 230 corresponding to a start point of a third transmission slot 209, so that the transceiver circuit 120 again starts a Bluetooth signal transmission operation according to the transmission slot indication signal 230.

The above analogy can also apply to the subsequent operation, so the transceiver circuit 120 is enabled to alternately switch between a transmission mode and a receiving mode according to the relevant indication signals generated by the first time slot determining circuit 116.

As can be appreciated from the foregoing descriptions, the transmission slot indication signal 210, the transmission slot indication signal 220, and the transmission slot indication signal 230 generated by the first time slot determining circuit 116 based on the second count value CV2 respectively correspond to different transmission events, and can be respectively employed to configure the timing of the first transmission slot 201, the second transmission slot 205, and the third transmission slot 209.

In above situation, a first slot interval P1 between the first transmission slot 201 and the second transmission slot 205 is the same as a second slot interval P2 between the second transmission slot 205 and the third transmission slot 209.

In addition, as shown in the upper part of FIG. 2 through FIG. 7, in each transmission slot, the first time slot determining circuit 116 may further generate a corresponding switch signal when the second count value CV2 reaches a predetermined value, so as to instruct the transceiver circuit 120 to switch to a different frequency or a different channel to conduct the Bluetooth signal transmission.

For example, in the first transmission slot 201, when the second count value CV2 reaches a first target value, the first time slot determining circuit 116 may generate a switch signal 212 to instruct the transceiver circuit 120 to switch to a different frequency or a different channel to conduct the Bluetooth signal transmission.

For another example, in the second transmission slot 205, when the second count value CV2 reaches a second target value, the first time slot determining circuit 116 may generate a switch signal 222 to instruct the transceiver circuit 120 to switch to a different frequency or a different channel to conduct the Bluetooth signal transmission.

For another example, in the third transmission slot 209, when the second count value CV2 reaches a third target value, the first time slot determining circuit 116 may generate a switch signal 232 to instruct the transceiver circuit 120 to switch to a different frequency or a different channel to conduct the Bluetooth signal transmission.

It can be appreciated from the foregoing descriptions that the switch signal 212, the switch signal 222, and the switch signal 232 generated by the first time slot determining circuit 116 respectively correspond to different transmission events.

In above situation, a time interval between two adjacent transmission events in the first transmission slot 201 (e.g., the transmission event corresponding to the transmission slot indication signal 210 and the transmission event corresponding to the switch signal 212) is L0; a time interval between two adjacent transmission events in the second transmission slot 205 (e.g., the transmission event corresponding to the transmission slot indication signal 220 and the transmission event corresponding to the switch signal 222) is L0; and a time interval between two adjacent transmission events in the third transmission slot 209 (e.g., the transmission event corresponding to the transmission slot indication signal 230 and the transmission event corresponding to the switch signal 232) is also L0.

As described previously, the control circuit 140 may control the first count value adjusting circuit 114 to utilize different approaches to generate the second count value CV2 in different operation stages of the Bluetooth controller circuit 100, and may control the first time slot determining circuit 116 to utilize different approaches to decide the timing of respective transmission slots.

For example, the control circuit 140 may instruct the first count value adjusting circuit 114 to adjust the first count value CV1 generated by the first clock counter 112 to generate a second count value CV2 in a predetermined operation stage (e.g., before the Bluetooth controller circuit 100 conducts Bluetooth pairing with other Bluetooth circuit), so that the magnitude of the second count value CV2 intermittently exhibits a non-linear change. In operations, the first count value adjusting circuit 114 may generate the second count value CV2 by intermittently increasing magnitude of the first count value CV1, by intermittently decreasing the magnitude of the first count value CV1, by periodically increasing the magnitude of the first count value CV1, or by periodically decreasing the magnitude of the first count value CV1.

For example, the first count value adjusting circuit 114 may intermittently add a fixed value, a variable value, or a random value to the first count value CV1 to generate the second count value CV2. In this situation, the increment speed of the second count value CV2 is faster than that of the first count value CV1, and the time point at which the second count value CV2 reaches a certain value will be advanced in comparison with the original case.

For another example, the first count value adjusting circuit 114 may intermittently subtract a fixed value, a variable value, or a random value from the first count value CV1 to generate the second count value CV2. In this situation, the increment speed of the second count value CV2 is slower than that of the first count value CV1, and the time point at which the second count value CV2 reaches a certain value will be delayed in comparison with the original case.

For another example, the first count value adjusting circuit 114 may periodically add a fixed value, a variable value, or a random value to the first count value CV1 to generate the second count value CV2. In this situation, the increment speed of the second count value CV2 is faster than that of the first count value CV1, and the time point at which the second count value CV2 reaches a certain value will be advanced in comparison with the original case.

For another example, the first count value adjusting circuit 114 may periodically subtract a fixed value, a variable value, or a random value from the first count value CV1 to generate the second count value CV2. In this situation, the increment speed of the second count value CV2 is slower than that of the first count value CV1, and the time point at which the second count value CV2 reaches a certain value will be delayed in comparison with the original case.

In one embodiment, the aforementioned fixed value, variable value, and/or random value is decided by the first count value adjusting circuit 114. In another embodiment, the aforementioned fixed value, variable value, and/or random value is configured by the control circuit 140.

When adopting the aforementioned approaches, the magnitude of the second count value CV2 generated by the first count value adjusting circuit 114 will not continuously increase steadily. Instead, the magnitude of the second count value CV2 will intermittently change non-linearly to exhibit a non-linear change. In operations, the first count value adjusting circuit 114 may generate the second count value CV2 by adopting a hybrid of different approaches described above to thereby adjust the time point at which the second count value CV2 reaches a certain value.

As described previously, the first time slot determining circuit 116 decides the timing of respective transmission slots according to the second count value CV2. Accordingly, when the first count value adjusting circuit 114 utilizes the aforementioned approaches to adjust the time point at which the second count value CV2 reaches a certain value, the first time slot determining circuit 116 is enabled to adjust the timing of respective transmission slots based on the second count value CV2 to cause the interval between adjacent transmission slots to not remain consistency.

For example, the first count value adjusting circuit 114 may adopt various approaches described previously to make the second count value CV2 to reach a specific value in advance. In this situation, the first time slot determining circuit 116 is enabled to advance the timing of a specific transmission slot according to the second count value CV2.

For another example, the first count value adjusting circuit 114 may adopt various approaches described previously to postpone the time point at which the second count value CV2 reaches a specific value. In this situation, the first time slot determining circuit 116 is enabled to delay the timing of a specific transmission slot according to the second count value CV2.

Since the magnitude of the second count value CV2 intermittently exhibits a non-linear change, the first time slot determining circuit 116 may adjust the timing of different transmission slots differently to ensure that the time intervals between adjacent transmission slots do not maintain consistency.

In addition, when the first count value adjusting circuit 114 adopts the aforementioned approaches to adjust the time point at which the second count value CV2 reaches a specific value, the first time slot determining circuit 116 may further adjust the generation timing of respective switch signals in a specific transmission slot according to the second count value CV2 to adjust the trigger timing of respective transmission events, to thereby cause the intervals between adjacent transmission events in the specific transmission slot to not remain consistency.

For example, the first count value adjusting circuit 114 may adopt various approaches described previously to make the second count value CV2 to reach a specific value in advance. In this situation, the first time slot determining circuit 116 is enabled to advance the generation timing of one or more switch signals to thereby advance the trigger timing of one or more corresponding transmission events.

For another example, the first count value adjusting circuit 114 may adopt various approaches described previously to postpone the time point at which the second count value CV2 reaches a specific value. In this situation, the first time slot determining circuit 116 is enabled to delay the generation timing of one or more switch signals to thereby delay the trigger timing of one or more corresponding transmission events.

Since the magnitude of the second count value CV2 intermittently exhibits a non-linear change, the first time slot determining circuit 116 may adjust the trigger timing of different transmission events differently to ensure that the time intervals between adjacent transmission events in the same transmission slot do not maintain consistency.

Different embodiments of FIG. 2 through FIG. 7 will be further described in the following.

Figure 2:
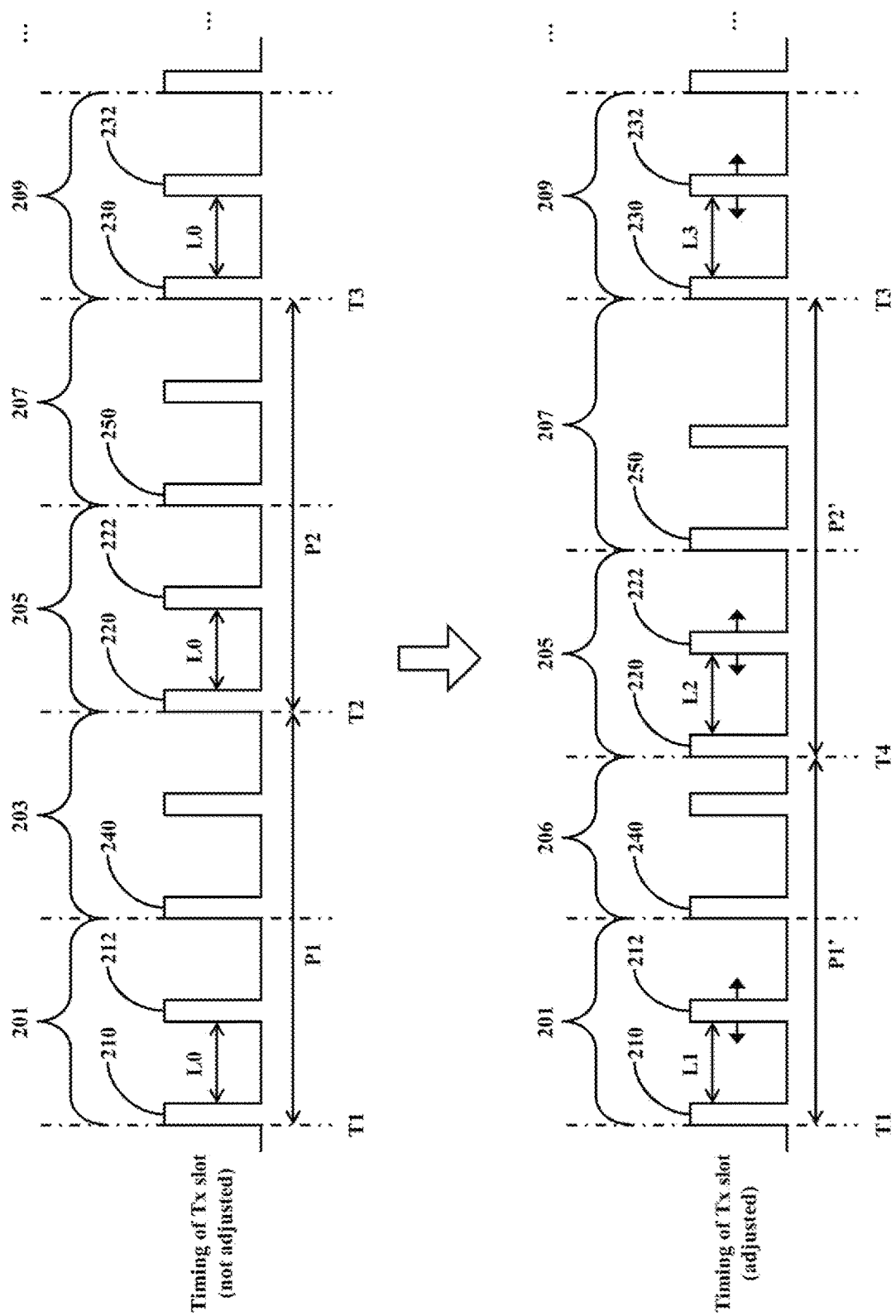
FIG. 2 shows a simplified schematic slot timing diagram illustrating dynamical slot timing adjustment conducted by the Bluetooth controller circuit of FIG. 1 according to a first embodiment of the present disclosure.

In the embodiment of FIG. 2, the first time slot determining circuit 116 also generates the transmission slot indication signal 210 according to the second count value CV2 at the first time point T1, and also generates the transmission slot indication signal 230 according to the second count value CV2 at the third time point T3. Accordingly, in comparison with the original case, the first time slot determining circuit 116 does not change the timing of the first transmission slot 201 and the timing of the third transmission slot 209.

However, the first time slot determining circuit 116 generates the transmission slot indication signal 220 according to the second count value CV2 at a fourth time point T4 prior to the second time point T2 in the embodiment of FIG. 2. As a result, the first time slot determining circuit 116 advances the timing of the second transmission slot 205 in comparison with the original case.

In this situation, a first adjusted slot interval P1' between the first transmission slot 201 and the second transmission slot 205 will be shorter than the first slot interval P1 of the original case, and a second adjusted slot interval P2' between the second transmission slot 205 and the third transmission slot 209 will be longer than the first adjusted slot interval P1' of the original case.

Accordingly, the original periodic relationship of a plurality of transmission slots (for example, the first transmission slot 201, the second transmission slot 205, and the third transmission slot 209) can destroyed by adopting the transmission slot timing adjusting method of FIG. 2.

Additionally, in the embodiment of FIG. 2, the first time slot determining circuit 116 may adjust the generation timing of respective switch signals (e.g., the switch signal 212) in the first transmission slot 201 according to the second count value CV2 to advance or delay the trigger timing of related transmission events. In this situation, the first time slot determining circuit 116 is enabled to adjust the time interval between the first two adjacent transmission events in the first transmission slot 201 (i.e., the transmission event corresponding to the transmission slot indication signal 210 and the transmission event corresponding to the switch signal 212) from L0 to be L1.

Similarly, the first time slot determining circuit 116 may adjust the generation timing of respective switch signals (e.g., the switch signal 222) in the second transmission slot 205 according to the second count value CV2 to advance or delay the trigger timing of related transmission events. In this situation, the first time slot determining circuit 116 is enabled to adjust the time interval between the first two adjacent transmission events in the second transmission slot 205 (i.e., the transmission event corresponding to the transmission slot indication signal 220 and the transmission event corresponding to the switch signal 222) from L0 to be L2.

Similarly, the first time slot determining circuit 116 may adjust the generation timing of respective switch signals (e.g., the switch signal 232) in the third transmission slot 209 according to the second count value CV2 to advance or delay the trigger timing of related transmission events. In this situation, the first time slot determining circuit 116 is enabled to adjust the time interval between the first two adjacent transmission events in the third transmission slot 209 (i.e., the transmission event corresponding to the transmission slot indication signal 230 and the transmission event corresponding to the switch signal 232) from L0 to be L3. In practice, the aforementioned time interval L1, time interval L2, and time interval L3 may be different from each other.

Figure 3:
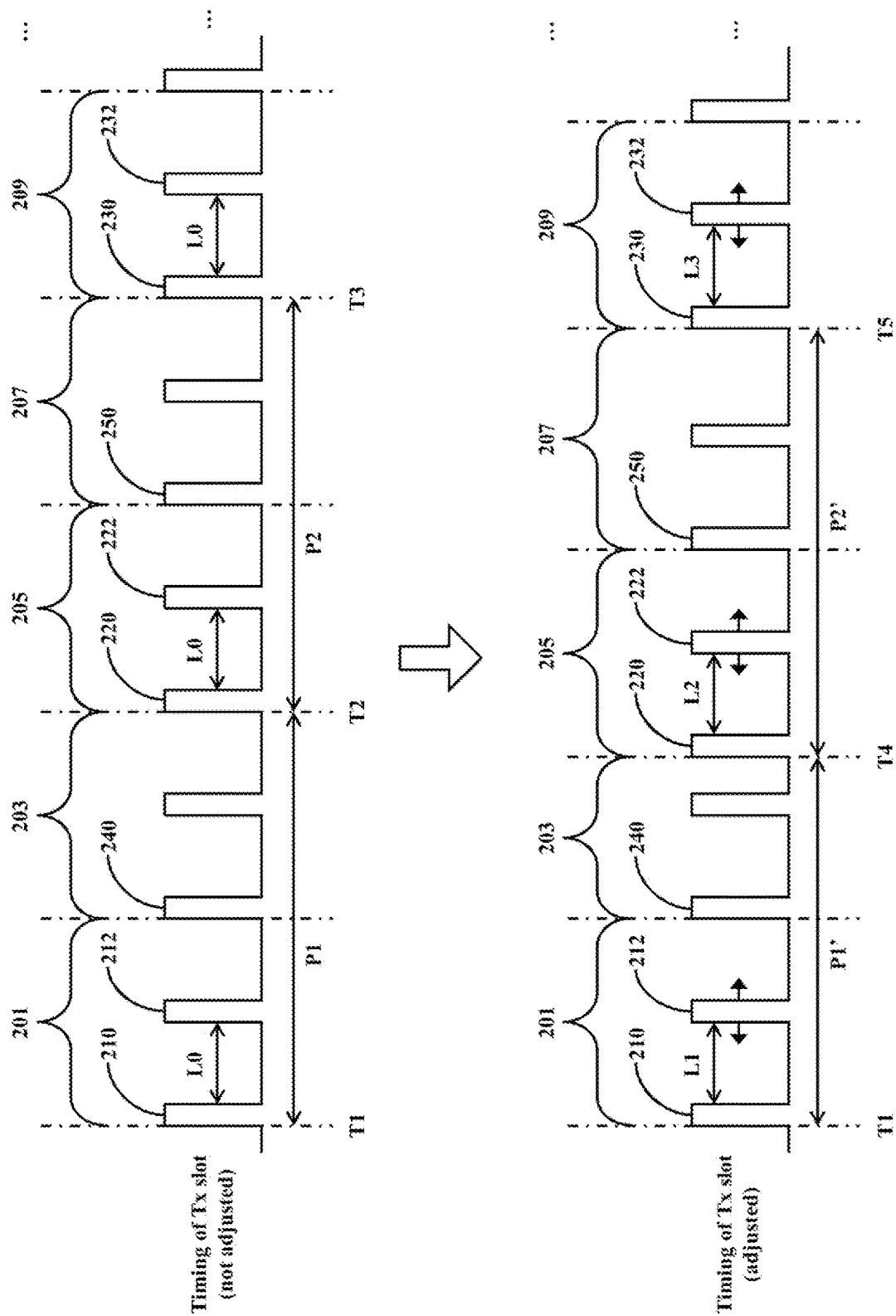
FIG. 3 shows a simplified schematic slot timing diagram illustrating dynamical slot timing adjustment conducted by the Bluetooth controller circuit of FIG. 1 according to a second embodiment of the present disclosure.

In the embodiment of FIG. 3, the first time slot determining circuit 116 also generates the transmission slot indication signal 210 according to the second count value CV2 at the first time point T1. Accordingly, in comparison with the original case, the first time slot determining circuit 116 does not change the timing of the first transmission slot 201.

However, the first time slot determining circuit 116 of the embodiment of FIG. 3 generates the transmission slot indication signal 220 according to the second count value CV2 at a fourth time point T4 prior to the second time point T2, and generates the transmission slot indication signal 230 according to the second count value CV2 at a fifth time point T5 prior to the third time point T3. As a result, the first time slot determining circuit 116 advances the timing of the second transmission slot 205 and the third transmission slot 209 in comparison with the original case, but the adjustment amount of the timing of the second transmission slot 205 and the adjustment amount of the timing of the third transmission time slot 209 are not required to restricted be the same.

In this situation, the first adjusted slot interval P1' between the first transmission slot 201 and the second transmission slot 205 will be shorter than the first slot interval P1 of the original case, while the second adjusted slot interval P2' between the second transmission slot 205 and the third transmission slot 209 may be longer than or shorter than the first adjusted slot interval P1.

Accordingly, the original periodic relationship of a plurality of transmission slots (for example, the first transmission slot 201, the second transmission slot 205, and the third transmission slot 209) can destroyed by adopting the transmission slot timing adjusting method of FIG. 3.

Additionally, in the embodiment of FIG. 3, the first time slot determining circuit 116 may adjust the generation timing of respective switch signals (e.g., the switch signal 212) in the first transmission slot 201 according to the second count value CV2 to advance or delay the trigger timing of related transmission events. In this situation, the first time slot determining circuit 116 is enabled to adjust the time interval between the first two adjacent transmission events in the first transmission slot 201 (i.e., the transmission event corresponding to the transmission slot indication signal 210 and the transmission event corresponding to the switch signal 212) from L0 to be L1.

Similarly, the first time slot determining circuit 116 may adjust the generation timing of respective switch signals (e.g., the switch signal 222) in the second transmission slot 205 according to the second count value CV2 to advance or delay the trigger timing of related transmission events. In this situation, the first time slot determining circuit 116 is enabled to adjust the time interval between the first two adjacent transmission events in the second transmission slot 205 (i.e., the transmission event corresponding to the transmission slot indication signal 220 and the transmission event corresponding to the switch signal 222) from L0 to be L2.

Similarly, the first time slot determining circuit 116 may adjust the generation timing of respective switch signals (e.g., the switch signal 232) in the third transmission slot 209 according to the second count value CV2 to advance or delay the trigger timing of related transmission events. In this situation, the first time slot determining circuit 116 is enabled to adjust the time interval between the first two adjacent transmission events in the third transmission slot 209 (i.e., the transmission event corresponding to the transmission slot indication signal 230 and the transmission event corresponding to the switch signal 232) from L0 to be L3. In practice, the aforementioned time interval L1, time interval L2, and time interval L3 may be different from each other.

Figure 4:
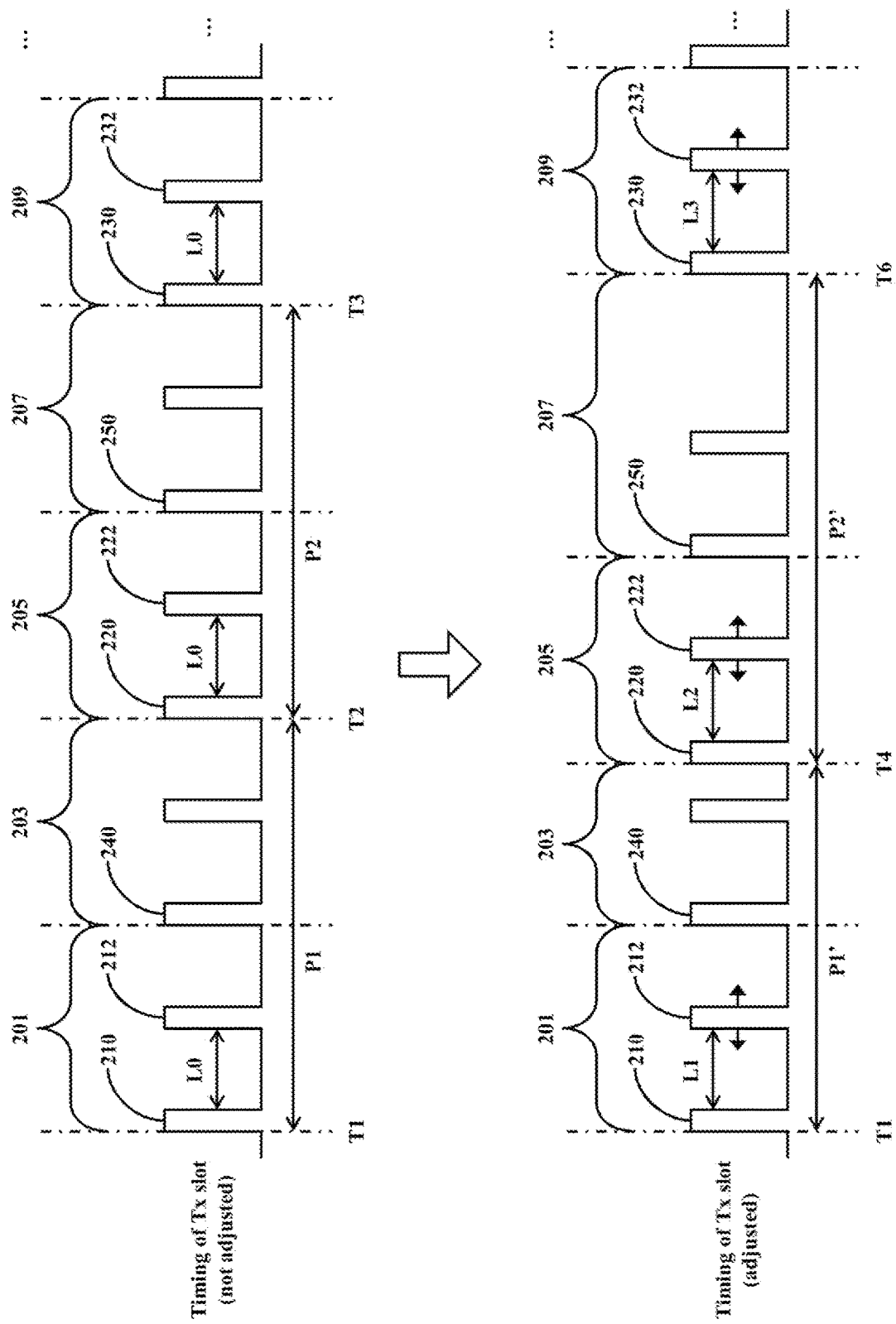
FIG. 4 shows a simplified schematic slot timing diagram illustrating dynamical slot timing adjustment conducted by the Bluetooth controller circuit of FIG. 1 according to a third embodiment of the present disclosure.

In the embodiment of FIG. 4, the first time slot determining circuit 116 also generates the transmission slot indication signal 210 according to the second count value CV2 at the first time point T1. Accordingly, in comparison with the original case, the first time slot determining circuit 116 does not change the timing of the first transmission slot 201.

However, the first time slot determining circuit 116 of the embodiment of FIG. 4 generates the transmission slot indication signal 220 according to the second count value CV2 at the fourth time point T4 prior to the second time point T2, and generates the transmission slot indication signal 230 according to the second count value CV2 at a sixth time point T6 after the third time point T3. As a result, the first time slot determining circuit 116 advances the timing of the second transmission slot 205 and postpones the timing of the third transmission slot 209 in comparison with the original case.

In this situation, the first adjusted slot interval P1' between the first transmission slot 201 and the second transmission slot 205 will be shorter than the first slot interval P1 of the original case, while the second adjusted slot interval P2' between the second transmission slot 205 and the third transmission slot 209 will be longer than the first adjusted slot interval P1.

Accordingly, the original periodic relationship of a plurality of transmission slots (for example, the first transmission slot 201, the second transmission slot 205, and the third transmission slot 209) can destroyed by adopting the transmission slot timing adjusting method of FIG. 4.

Additionally, in the embodiment of FIG. 4, the first time slot determining circuit 116 may adjust the generation timing of respective switch signals (e.g., the switch signal 212) in the first transmission slot 201 according to the second count value CV2 to advance or delay the trigger timing of related transmission events. In this situation, the first time slot determining circuit 116 is enabled to adjust the time interval between the first two adjacent transmission events in the first transmission slot 201 (i.e., the transmission event corresponding to the transmission slot indication signal 210 and the transmission event corresponding to the switch signal 212) from L0 to be L1.

Similarly, the first time slot determining circuit 116 may adjust the generation timing of respective switch signals (e.g., the switch signal 222) in the second transmission slot 205 according to the second count value CV2 to advance or delay the trigger timing of related transmission events. In this situation, the first time slot determining circuit 116 is enabled to adjust the time interval between the first two adjacent transmission events in the second transmission slot 205 (i.e., the transmission event corresponding to the transmission slot indication signal 220 and the transmission event corresponding to the switch signal 222) from L0 to be L2.

Similarly, the first time slot determining circuit 116 may adjust the generation timing of respective switch signals (e.g., the switch signal 232) in the third transmission slot 209 according to the second count value CV2 to advance or delay the trigger timing of related transmission events. In this situation, the first time slot determining circuit 116 is enabled to adjust the time interval between the first two adjacent transmission events in the third transmission slot 209 (i.e., the transmission event corresponding to the transmission slot indication signal 230 and the transmission event corresponding to the switch signal 232) from L0 to be L3. In practice, the aforementioned time interval L1, time interval L2, and time interval L3 may be different from each other.

Figure 5:
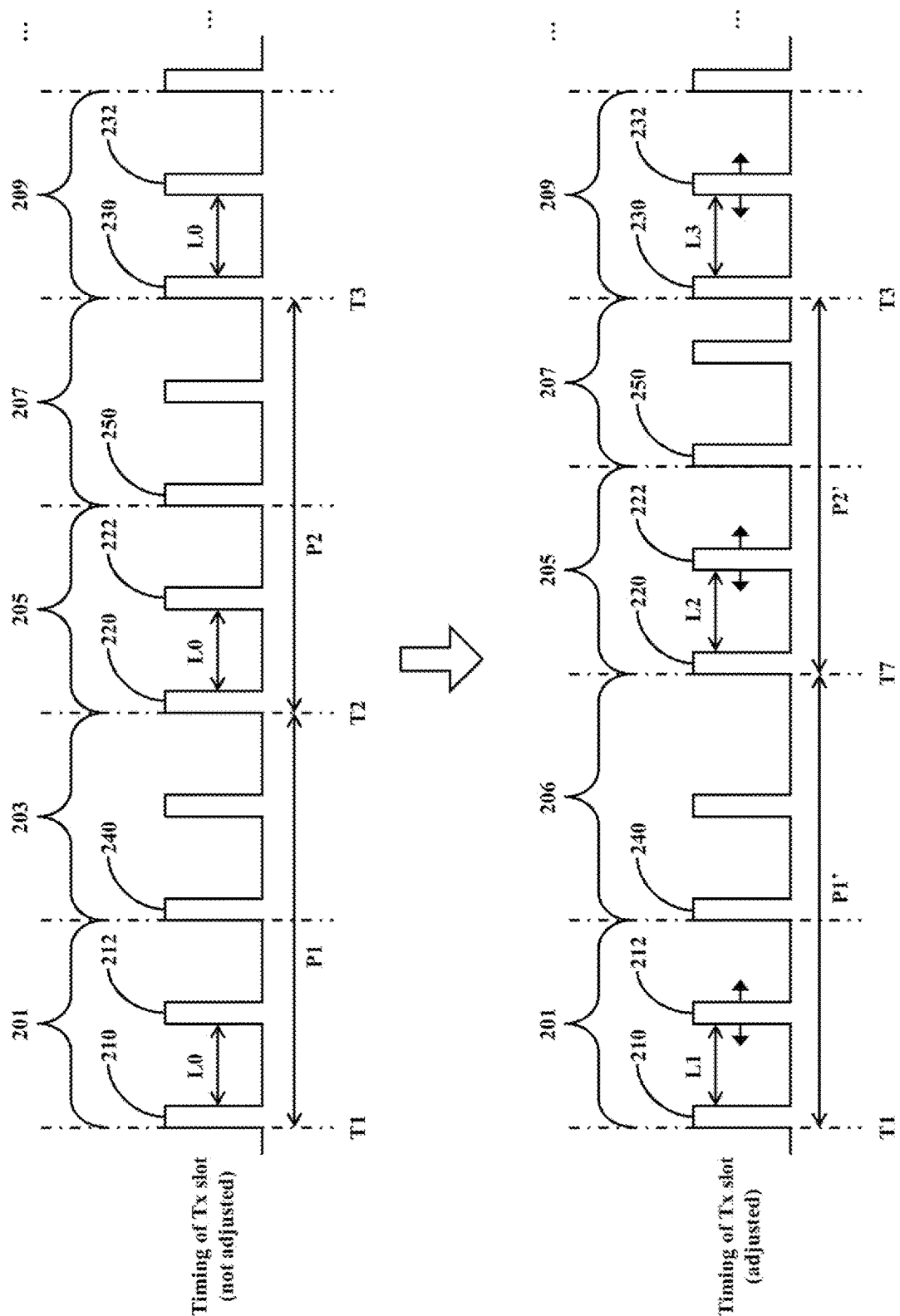
FIG. 5 shows a simplified schematic slot timing diagram illustrating dynamical slot timing adjustment conducted by the Bluetooth controller circuit of FIG. 1 according to a fourth embodiment of the present disclosure.

In the embodiment of FIG. 5, the first time slot determining circuit 116 also generates the transmission slot indication signal 210 according to the second count value CV2 at the first time point T1, and also generates the transmission slot indication signal 230 according to the second count value CV2 at the third time point T3. Accordingly, in comparison with the original case, the first time slot determining circuit 116 does not change the timing of the first transmission slot 201 and the timing of the third transmission slot 209.

However, the first time slot determining circuit 116 generates the transmission slot indication signal 220 according to the second count value CV2 at a seventh time point T4 after the second time point T2 in the embodiment of FIG. 5. As a result, the first time slot determining circuit 116 postpones the timing of the second transmission slot 205 in comparison with the original case.

In this situation, the first adjusted slot interval P1' between the first transmission slot 201 and the second transmission slot 205 will be longer than the first slot interval P1 of the original case, and a second adjusted slot interval P2' between the second transmission slot 205 and the third transmission slot 209 will be shorter than the first adjusted slot interval P1' of the original case.

Accordingly, the original periodic relationship of a plurality of transmission slots (for example, the first transmission slot 201, the second transmission slot 205, and the third transmission slot 209) can destroyed by adopting the transmission slot timing adjusting method of FIG. 5.

Additionally, in the embodiment of FIG. 5, the first time slot determining circuit 116 may adjust the generation timing of respective switch signals (e.g., the switch signal 212) in the first transmission slot 201 according to the second count value CV2 to advance or delay the trigger timing of related transmission events. In this situation, the first time slot determining circuit 116 is enabled to adjust the time interval between the first two adjacent transmission events in the first transmission slot 201 (i.e., the transmission event corresponding to the transmission slot indication signal 210 and the transmission event corresponding to the switch signal 212) from L0 to be L1.

Similarly, the first time slot determining circuit 116 may adjust the generation timing of respective switch signals (e.g., the switch signal 222) in the second transmission slot 205 according to the second count value CV2 to advance or delay the trigger timing of related transmission events. In this situation, the first time slot determining circuit 116 is enabled to adjust the time interval between the first two adjacent transmission events in the second transmission slot 205 (i.e., the transmission event corresponding to the transmission slot indication signal 220 and the transmission event corresponding to the switch signal 222) from L0 to be L2.

Similarly, the first time slot determining circuit 116 may adjust the generation timing of respective switch signals (e.g., the switch signal 232) in the third transmission slot 209 according to the second count value CV2 to advance or delay the trigger timing of related transmission events. In this situation, the first time slot determining circuit 116 is enabled to adjust the time interval between the first two adjacent transmission events in the third transmission slot 209 (i.e., the transmission event corresponding to the transmission slot indication signal 230 and the transmission event corresponding to the switch signal 232) from L0 to be L3. In practice, the aforementioned time interval L1, time interval L2, and time interval L3 may be different from each other.

Figure 6:
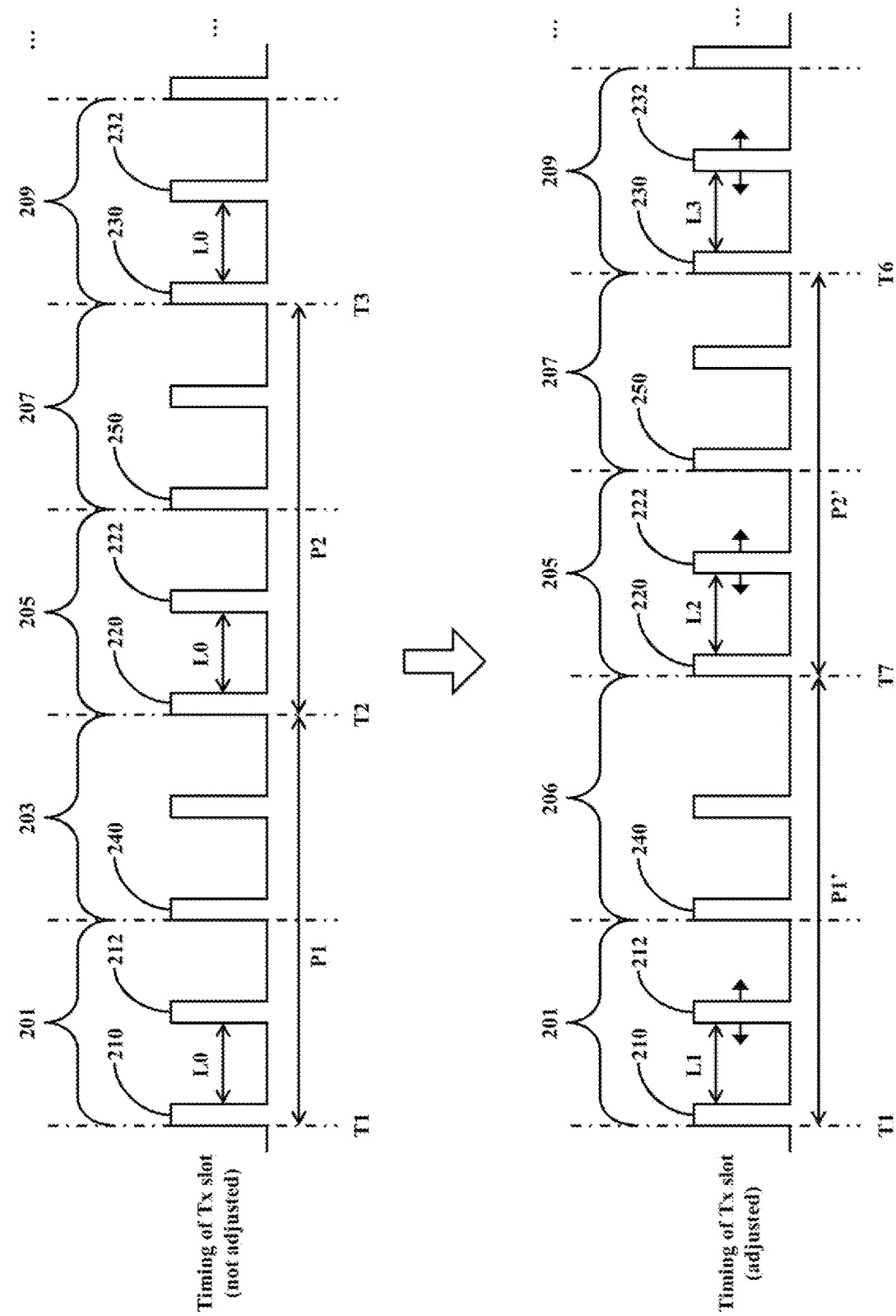
FIG. 6 shows a simplified schematic slot timing diagram illustrating dynamical slot timing adjustment conducted by the Bluetooth controller circuit of FIG. 1 according to a fifth embodiment of the present disclosure.

In the embodiment of FIG. 6, the first time slot determining circuit 116 also generates the transmission slot indication signal 210 according to the second count value CV2 at the first time point T1. Accordingly, in comparison with the original case, the first time slot determining circuit 116 does not change the timing of the first transmission slot 201.

However, the first time slot determining circuit 116 of the embodiment of FIG. 6 generates the transmission slot indication signal 220 according to the second count value CV2 at the seventh time point T7 after the second time point T2, and generates the transmission slot indication signal 230 according to the second count value CV2 at the sixth time point T6 after the third time point T3. As a result, the first time slot determining circuit 116 postpones the timing of the second transmission slot 205 and the third transmission slot 209 in comparison with the original case, but the adjustment amount of the timing of the second transmission slot 205 and the adjustment amount of the timing of the third transmission time slot 209 are not required to restricted be the same.

In this situation, the first adjusted slot interval P1' between the first transmission slot 201 and the second transmission slot 205 will be longer than the first slot interval P1 of the original case, while the second adjusted slot interval P2' between the second transmission slot 205 and the third transmission slot 209 may be longer than or shorter than the first adjusted slot interval P1.

Accordingly, the original periodic relationship of a plurality of transmission slots (for example, the first transmission slot 201, the second transmission slot 205, and the third transmission slot 209) can destroyed by adopting the transmission slot timing adjusting method of FIG. 6.

Additionally, in the embodiment of FIG. 6, the first time slot determining circuit 116 may adjust the generation timing of respective switch signals (e.g., the switch signal 212) in the first transmission slot 201 according to the second count value CV2 to advance or delay the trigger timing of related transmission events. In this situation, the first time slot determining circuit 116 is enabled to adjust the time interval between the first two adjacent transmission events in the first transmission slot 201 (i.e., the transmission event corresponding to the transmission slot indication signal 210 and the transmission event corresponding to the switch signal 212) from L0 to be L1.

Similarly, the first time slot determining circuit 116 may adjust the generation timing of respective switch signals (e.g., the switch signal 222) in the second transmission slot 205 according to the second count value CV2 to advance or delay the trigger timing of related transmission events. In this situation, the first time slot determining circuit 116 is enabled to adjust the time interval between the first two adjacent transmission events in the second transmission slot 205 (i.e., the transmission event corresponding to the transmission slot indication signal 220 and the transmission event corresponding to the switch signal 222) from L0 to be L2.

Similarly, the first time slot determining circuit 116 may adjust the generation timing of respective switch signals (e.g., the switch signal 232) in the third transmission slot 209 according to the second count value CV2 to advance or delay the trigger timing of related transmission events. In this situation, the first time slot determining circuit 116 is enabled to adjust the time interval between the first two adjacent transmission events in the third transmission slot 209 (i.e., the transmission event corresponding to the transmission slot indication signal 230 and the transmission event corresponding to the switch signal 232) from L0 to be L3. In practice, the aforementioned time interval L1, time interval L2, and time interval L3 may be different from each other.

Figure 7:
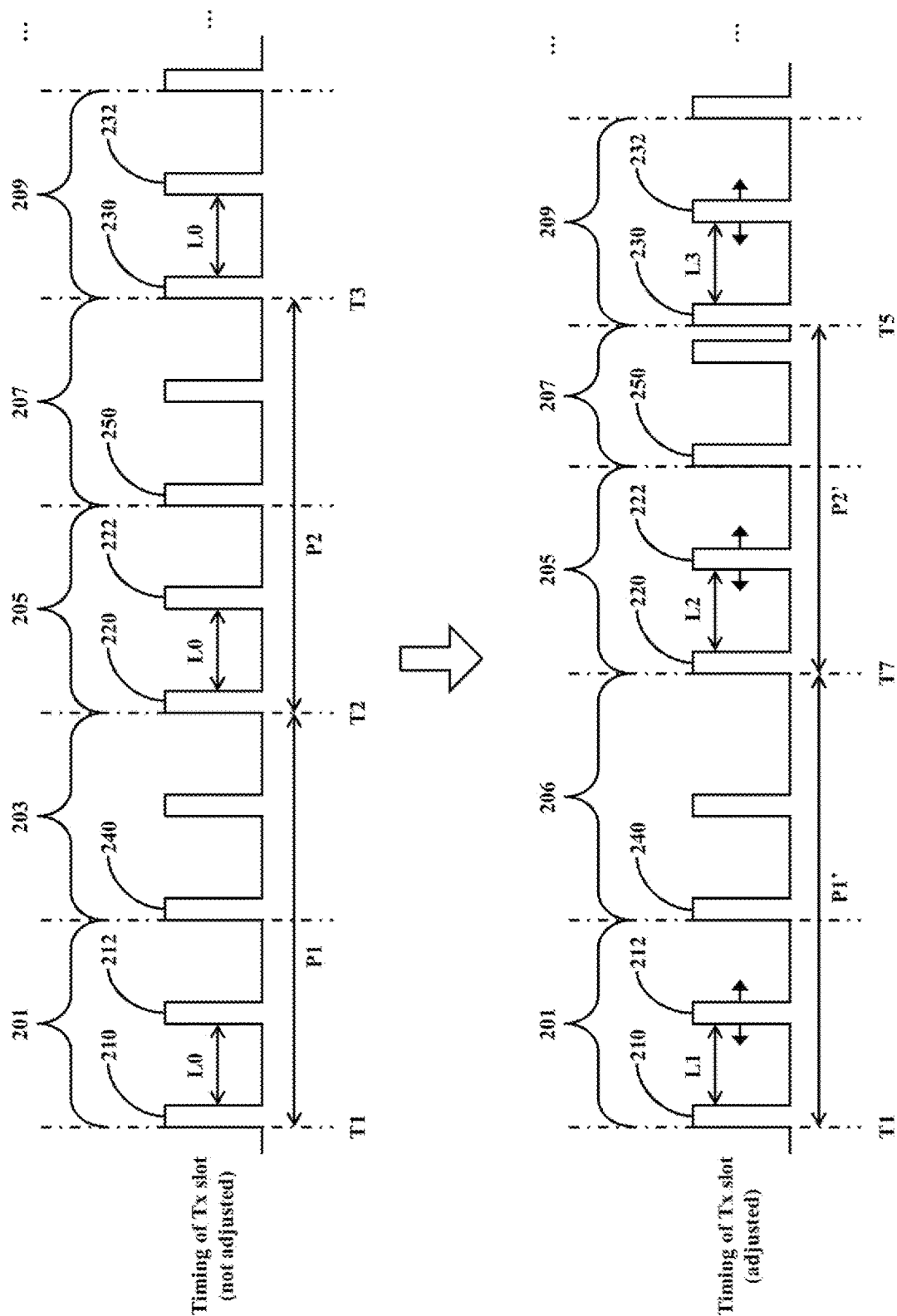
FIG. 7 shows a simplified schematic slot timing diagram illustrating dynamical slot timing adjustment conducted by the Bluetooth controller circuit of FIG. 1 according to a sixth embodiment of the present disclosure.

In the embodiment of FIG. 7, the first time slot determining circuit 116 also generates the transmission slot indication signal 210 according to the second count value CV2 at the first time point T1. Accordingly, in comparison with the original case, the first time slot determining circuit 116 does not change the timing of the first transmission slot 201.

However, the first time slot determining circuit 116 of the embodiment of FIG. 7 generates the transmission slot indication signal 220 according to the second count value CV2 at the seventh time point T7 after the second time point T2, and generates the transmission slot indication signal 230 according to the second count value CV2 at the fifth time point T5 prior to the third time point T3. As a result, the first time slot determining circuit 116 postpones the timing of the second transmission slot 205 and advances the timing of the third transmission slot 209 in comparison with the original case, but the adjustment amount of the timing of the second transmission slot 205 and the adjustment amount of the timing of the third transmission time slot 209 are not required to restricted be the same.

In this situation, the first adjusted slot interval P1' between the first transmission slot 201 and the second transmission slot 205 will be longer than the first slot interval P1 of the original case, while the second adjusted slot interval P2' between the second transmission slot 205 and the third transmission slot 209 will be shorter than the first adjusted slot interval P1.

Accordingly, the original periodic relationship of a plurality of transmission slots (for example, the first transmission slot 201, the second transmission slot 205, and the third transmission slot 209) can destroyed by adopting the transmission slot timing adjusting method of FIG. 7.

Additionally, in the embodiment of FIG. 7, the first time slot determining circuit 116 may adjust the generation timing of respective switch signals (e.g., the switch signal 212) in the first transmission slot 201 according to the second count value CV2 to advance or delay the trigger timing of related transmission events. In this situation, the first time slot determining circuit 116 is enabled to adjust the time interval between the first two adjacent transmission events in the first transmission slot 201 (i.e., the transmission event corresponding to the transmission slot indication signal 210 and the transmission event corresponding to the switch signal 212) from L0 to be L1.

Similarly, the first time slot determining circuit 116 may adjust the generation timing of respective switch signals (e.g., the switch signal 222) in the second transmission slot 205 according to the second count value CV2 to advance or delay the trigger timing of related transmission events. In this situation, the first time slot determining circuit 116 is enabled to adjust the time interval between the first two adjacent transmission events in the second transmission slot 205 (i.e., the transmission event corresponding to the transmission slot indication signal 220 and the transmission event corresponding to the switch signal 222) from L0 to be L2.

Similarly, the first time slot determining circuit 116 may adjust the generation timing of respective switch signals (e.g., the switch signal 232) in the third transmission slot 209 according to the second count value CV2 to advance or delay the trigger timing of related transmission events. In this situation, the first time slot determining circuit 116 is enabled to adjust the time interval between the first two adjacent transmission events in the third transmission slot 209 (i.e., the transmission event corresponding to the transmission slot indication signal 230 and the transmission event corresponding to the switch signal 232) from L0 to be L3. In practice, the aforementioned time interval L1, time interval L2, and time interval L3 may be different from each other.

In the foregoing embodiments of FIG. 2 through FIG. 7, the first time slot determining circuit 116 may advance or postpone the timing of respective transmission slots according to the second count value CV2, and it is not limited that different transmission slots must have the same timing adjusting direction and/or timing adjustment amount. In practice, the first time slot determining circuit 116 may advance the timing of respective transmission slots by 2% to 19.5% according to the second count value CV2.

For example, the first count value adjusting circuit 114 may adopt various approaches described previously to adjust the time point at which the second count value CV2 reaches a certain value, so that the first time slot determining circuit 116 can advance the timing of a specific transmission slot by 3.5%, 5%, 7%, 8.5%, 10%, 12%, 15%, 17%, 18.5%, or 19.5%.

Additionally, in the foregoing embodiments of FIG. 2 through FIG. 7, the first time slot determining circuit 116 may advance or postpone the trigger timing of respective transmission events in the same transmission slot according to the second count value CV2, and it is not limited that the trigger timing of different transmission events must have the same adjusting direction and/or adjustment amount. In practice, the first time slot determining circuit 116 may advance the trigger timing of respective transmission events by 3% to 78% according to the second count value CV2, or may postpone the trigger timing of respective transmission events by 3% to 78% according to the second count value CV2.

For example, the first count value adjusting circuit 114 may adopt various approaches described previously to adjust the time point at which the second count value CV2 reaches a certain value, so that the first time slot determining circuit 116 can advance or delay the trigger timing of individual transmission event in the same transmission slot by 5%, 7.5%, 10%, 15%, 20%, 25%, 30%, 45%, 50%, 60%, or 75%.

On the other hand, after the Bluetooth controller circuit 100 completes the Bluetooth pairing operation with other Bluetooth circuit, the control circuit 140 may instruct the first count value adjusting circuit 114 to simply utilize the first count value CV1 currently generated by the first clock counter 112 to be the second count value CV2 at that time, without adjusting to the first count value CV1.

It can be appreciated from the foregoing descriptions that the first count value adjusting circuit 114 may adjust the first count value CV1 generated by the first clock counter 112 according to the instruction of the control circuit 140 to generate the second count value CV2, so that the magnitude of the second count value CV2 can intermittently change non-linearly to exhibit a non-linear change.

When the first count value adjusting circuit 114 adopts the disclosed approaches to adjust the time point at which the second count value CV2 reaches a specific value, the first time slot determining circuit 116 is enabled to adjust the timing of respective transmission slots according to the second count value CV2, to cause the intervals between adjacent transmission slots to not remain consistency.

In addition, when the first count value adjusting circuit 114 adopts the disclosed approaches to adjust the time point at which the second count value CV2 reaches a specific value, the first time slot determining circuit 116 is enabled to adjust the generation timing of respective switch signals in a specific transmission slot to adjust the trigger timing of respective transmission events, to thereby cause the intervals between adjacent transmission events in the specific transmission slot to not remain consistency.

It can be appreciated from the foregoing descriptions that the disclosed Bluetooth controller circuit 100 can dynamically adjust the timing of respective transmission slots and/or the trigger timing of respective transmission events, and thus can effectively destroy the periodicity of the Bluetooth packet transmission behavior of the transceiver circuit 120.

Since the Bluetooth controller circuit 100 can destroy the periodicity of the Bluetooth packet transmission behavior, it can effectively reduce the possibility that the Bluetooth controller circuit 100 or the related Bluetooth communication device in which the Bluetooth controller circuit 100 is installed generates noises that can be perceived by human ears.

In addition, periodic signals may cause electromagnetic interference (EMI) to peripheral circuits. Therefore, from another aspect, since the Bluetooth controller circuit 100 can destroy the periodicity of the Bluetooth packet transmission behavior by adopting the aforementioned slot timing adjusting approaches of FIG. 2 through FIG. 7, the Bluetooth controller circuit 100 can also reduce the possibility that the Bluetooth packet transmission behavior of the transceiver circuit 120 induces EMI to the internal circuits of the Bluetooth controller circuit 100 or other circuits (e.g., the audio playback circuit 104 or the sound capturing circuit 106).

Please note that the quantity and functionality of the functional blocks of the disclosed Bluetooth controller circuit 100 may be modified according to the requirement of actual circuit design, and are not restricted to the pattern in the aforementioned embodiments.

Figure 8:
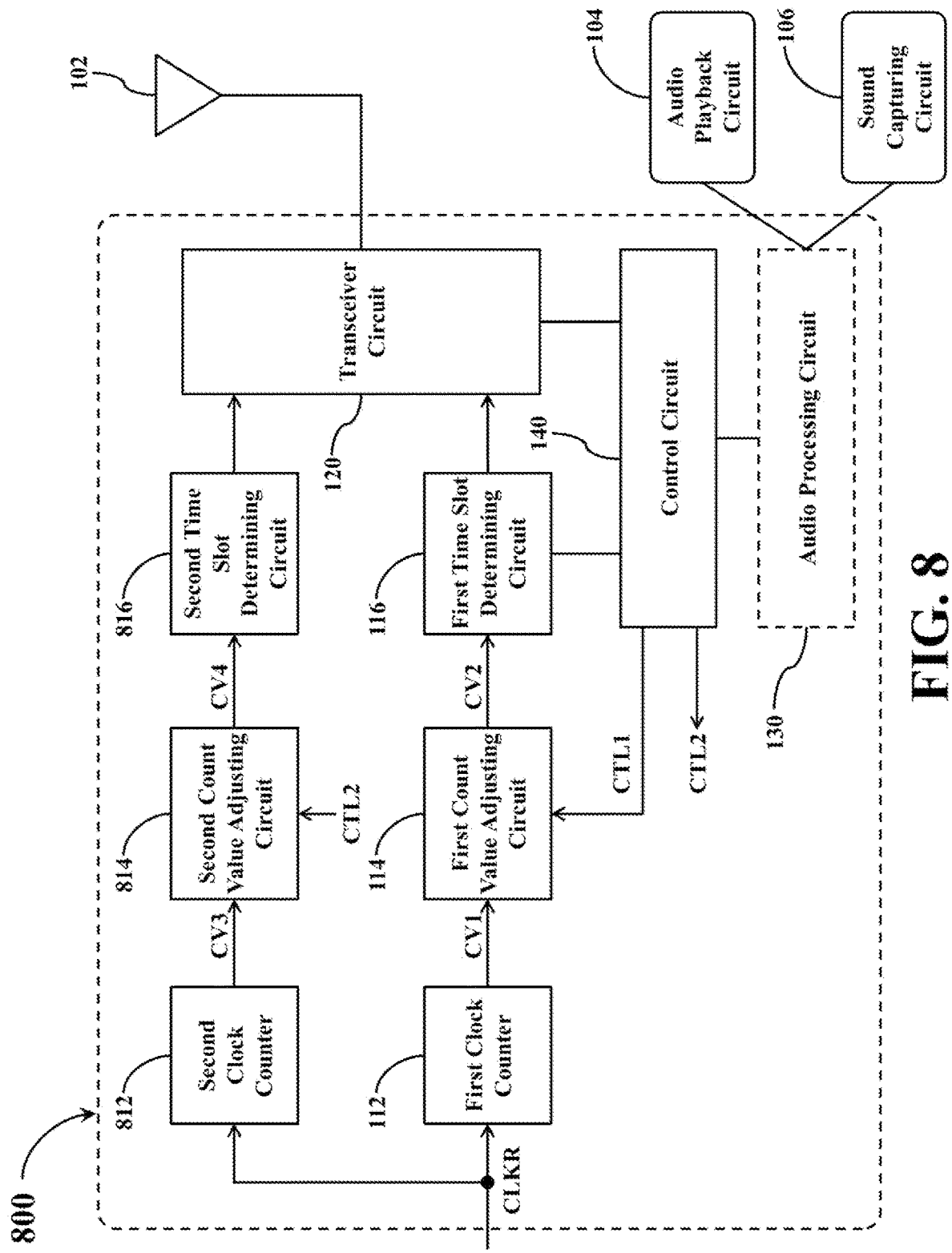
FIG. 8 shows a simplified functional block diagram of a Bluetooth controller circuit according to a second embodiment of the present disclosure.

For example, FIG. 8 shows a simplified functional block diagram of a Bluetooth controller circuit 800 according to a second embodiment of the present disclosure. The Bluetooth controller circuit 800 is similar to the aforementioned Bluetooth controller circuit 100, but the Bluetooth controller circuit 800 further comprise a second clock counter 812, a second count value adjusting circuit 814, and a second time slot determining circuit 816.

The second clock counter 812 is arranged to operably generate a third count value CV3 corresponding to a reference clock signal CLKR. For example, the second clock counter 812 may conduct a counting operation based on a specific edge (e.g., the rising edge or the falling edge) of the reference clock signal CLKR to generate a third count value CV3 corresponding to the quantity of the specific edge of the reference clock signal CLKR. In general, the reference clock signal CLKR has a stable frequency, and thus the magnitude of the third count value CV3 generated by the second clock counter 812 will increase stably and exhibit a linear change.

The second clock counter 812 may reset the magnitude of the third count value CV3 at an appropriate time.

The second count value adjusting circuit 814 is coupled with the second clock counter 812, and arranged to operably generate a fourth count value CV4 according to the third count value CV3.

The second time slot determining circuit 816 is coupled with the second count value adjusting circuit 814, and arranged to operably decide the timing of respective transmission slots (TX slots) and the timing of respective reception slots (RX slots) according to the fourth count value CV4.

In the embodiment of FIG. 8, the transceiver circuit 120 is coupled with the first time slot determining circuit 116, and further coupled with the second time slot determining circuit 816, and arranged to operably transmit Bluetooth signals in the transmission slots configured by the second time slot determining circuit 816, and arranged to operably receive Bluetooth signals in the reception slots configured by the second time slot determining circuit 816.

Additionally, the control circuit 140 in the embodiment of FIG. 8 may utilize a second control signal CTL2 to control the second count value adjusting circuit 814 to generate the fourth count value CV4 by adopting different approaches in different operation stages of the Bluetooth controller circuit 800.

The foregoing descriptions regarding the connection relationships, the implementations, the operations, and related advantages of the first clock counter 112, the first count value adjusting circuit 114, and the first time slot determining circuit 116 of FIG. 1 are also applicable to the second clock counter 812, the second count value adjusting circuit 814, and the second time slot determining circuit 816 of FIG. 8. In addition, the foregoing descriptions regarding the connection relationships, the implementations, the operations, and related advantages of other circuits in FIG. 1 are also applicable to the embodiment FIG. 8. For the sake of brevity, the descriptions will not be repeated here.

The Bluetooth controller circuit 800 may utilize the cooperation of the first clock counter 112, the first count value adjusting circuit 114, and the first time slot determining circuit 116 to dynamically adjust the timing of transmission slots corresponding to a first piconet, while utilize the cooperation of the second clock counter 812, the second count value adjusting circuit 814, and the second time slot determining circuit 816 to dynamically adjust the timing of transmission slots corresponding to a second piconet.

In practice, each of the Bluetooth controller circuit 100 and the Bluetooth controller circuit 800 may be provided with more sets of circuits with aforementioned slot timing adjustment functionality, so that the Bluetooth controller circuit 100 and the Bluetooth controller circuit 800 can apply the disclosed transmission slot timing adjustment mechanism to more piconets at the same time.

In some embodiments where the Bluetooth controller circuit 100 and the Bluetooth controller circuit 800 do not need to capture the user's voice or ambient sounds, the sound capturing circuit 106 may be omitted.

In some embodiments where the Bluetooth controller circuit 100 and the Bluetooth controller circuit 800 do not need to play the audio data, the audio playback circuit 104 may be omitted.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to encompass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A Bluetooth controller circuit (100, 800), comprising:
a clock counter (112), arranged to operably generate a first count value (CV1) corresponding to a reference clock signal (CLKR);
a count value adjusting circuit (114), coupled with the clock counter (112), and arranged to operably adjust the first count value (CV1) to generate a second count value (CV2), so that magnitudes of the second count value (CV2) intermittently exhibits a non-linear change;
a time slot determining circuit (116), coupled with the count value adjusting circuit (114), and arranged to operably adjust timing of respective transmission slots according to the second count value (CV2) to cause interval between adjacent transmission slots to not remain consistency;
a transceiver circuit (120), coupled with the time slot determining circuit (116), and arranged to operably transmit Bluetooth signals in transmission slots configured by the time slot determining circuit (116); and
a control circuit (140), coupled with the count value adjusting circuit (114), the time slot determining circuit (116), and the transceiver circuit (120), and arranged to operably operations of the count value adjusting circuit (114), the time slot determining circuit (116), and the transceiver circuit (120);
wherein the time slot determining circuit (116) is further arranged to operably adjust trigger timing of respective transmission events within a target transmission slot according to the second count value (CV2) to cause interval between adjacent transmission events in the target transmission slot to not remain consistency.

2. A Bluetooth controller circuit (100, 800), comprising:
a clock counter (112) arranged to operably generate a first count value (CV1) corresponding to a reference clock signal (CLKR);
a count value adjusting circuit (114), coupled with the clock counter (112), and arranged to operably generate a second count value (CV2) according to the first count value (CV1);
a time slot determining circuit (116), coupled with the count value adjusting circuit (114), and arranged to operably configure timing of respective transmission slots according to the second count value (CV2);
a transceiver circuit (120), coupled with the time slot determining circuit (116), and arranged to operably transmit Bluetooth signals in transmission slots configured by the time slot determining circuit (116);
a control circuit (140), coupled with the count value adjusting circuit (114), the time slot determining circuit (116), and the transceiver circuit (120), and arranged to operably control operations of the count value adjusting circuit (114), the time slot determining circuit (116), and the transceiver circuit (120).

3. The Bluetooth controller circuit (100, 800) of claim 2, wherein the count value adjusting circuit (114) is arranged to operably adjust the first count value (CV1) according to instruction of the control circuit (140) to generate the second count value (CV2), so that magnitudes of the second count value (CV2) intermittently exhibits a non-linear change.

4. The Bluetooth controller circuit (100, 800) of claim 3, wherein the count value adjusting circuit (114) is further arranged to operably generate the second count value (CV2) by intermittently increasing magnitude of the first count value (CV1), by intermittently decreasing the magnitude of the first count value (CV1), by periodically increasing the magnitude of the first count value (CV1), or by periodically decreasing the magnitude of the first count value (CV1).

5. The Bluetooth controller circuit (100, 800) of claim 3, wherein the time slot determining circuit (116) is arranged to operably adjust timing of respective transmission slots according to the second count value (CV2) to cause interval between adjacent transmission slots to not remain consistency.

6. The Bluetooth controller circuit (100, 800) of claim 5, wherein the time slot determining circuit (116) is arranged to operably advance the timing of respective transmission slots by 3% to 19.5% according to the second count value (CV2).

7. The Bluetooth controller circuit (100, 800) of claim 5, wherein the time slot determining circuit (116) is further arranged to operably adjust trigger timing of respective transmission events within a target transmission slot according to the second count value (CV2) to cause interval between adjacent transmission events in the target transmission slot to not remain consistency.

8. The Bluetooth controller circuit (100, 800) of claim 7, wherein the time slot determining circuit (116) is arranged to operably advance the trigger timing of respective transmission events within the target transmission slot by 3% to 78%, or to operably delay the trigger timing of respective transmission events within the target transmission slot by 3% to 78%.

9. The Bluetooth controller circuit (100, 800) of claim 3, wherein the control circuit (140) is arranged to operably instruct the count value adjusting circuit (114) to adjust the first count value (CV1) to the second count value (CV2) before the Bluetooth controller circuit (100, 800) conducts Bluetooth pairing with other Bluetooth circuit.

10. The Bluetooth controller circuit (100, 800) of claim 9, wherein the control circuit (140) is further arranged to operably instruct the count value adjusting circuit (114) to utilize the first count value (CV1) to be the second count value (CV2) after the Bluetooth controller circuit (100, 800) completes Bluetooth pairing with other Bluetooth circuit.

* * * * *